US010128587B2

(12) United States Patent
Ho

(10) Patent No.: US 10,128,587 B2
(45) Date of Patent: Nov. 13, 2018

(54) POWER CONNECTION APPARATUS ASSEMBLY AND POWER CONNECTION APPARATUS

(71) Applicant: Molex, LLC, Lisle, IL (US)

(72) Inventor: Yi-Tse Ho, Taipei (TW)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/657,327

(22) Filed: Jul. 24, 2017

(65) Prior Publication Data

US 2018/0040968 A1 Feb. 8, 2018

(30) Foreign Application Priority Data

Aug. 4, 2016 (TW) ............................. 105211764 U

(51) Int. Cl.
*H01R 12/00* (2006.01)
*H01R 12/58* (2011.01)
(Continued)

(52) U.S. Cl.
CPC ......... *H01R 12/58* (2013.01); *H01R 12/7088* (2013.01); *H01R 12/73* (2013.01); *H01R 13/2492* (2013.01); *H05K 999/99* (2013.01)

(58) Field of Classification Search
CPC ....... H01R 12/52; H01R 12/716; H01R 9/096
(Continued)

(56) References Cited

U.S. PATENT DOCUMENTS 6,623,279 B2 * 9/2003 Derian ...................... G06F 1/18 257/E23.088
7,104,805 B2 * 9/2006 Hjort ...................... H05K 1/144 439/74
(Continued)

FOREIGN PATENT DOCUMENTS

| | | | |
|---|---|---|---|
| CN | 2374987 | Y | 4/2000 |
| CN | 201112601 | Y | 9/2008 |
| WO | WO 2014/047547 | A1 | 3/2014 |

*Primary Examiner* — Phuong Dinh
(74) *Attorney, Agent, or Firm* — James A. O'Malley

(57) ABSTRACT

A power connection apparatus assembly has first and second power connection apparatuses. The first apparatus includes a connecting unit and a first circuit board. The connecting unit has a conductive member and a positioning member, the conductive member has a mounting plate portion and an inserting plate portion bending from the mounting plate portion and extending. The mounting plate portion has a positioning hole, the positioning member has a flat plate portion cooperating with the mounting plate portion and a protruding post protruding from the flat plate portion to correspondingly pass through the positioning hole. The first circuit board has an insertion hole corresponding to the positioning hole in position to allow the protruding post to insert therein, the protruding post of the positioning member passes through the positioning hole of the mounting plate portion of the conductive member and inserts into the insertion hole so that the mounting plate portion and the first circuit board are positioned relative to each other. The second apparatus has a second circuit board and an electrical connector corresponding to the connecting unit. The inserting plate portion of the conductive member may insert into an insertion slot of the electrical connector, and after the conductive member and the electrical connector has mated with each other, the first circuit board and the second circuit board are parallel to each other.

27 Claims, 19 Drawing Sheets

(51) Int. Cl.
*H01R 12/70* (2011.01)
*H01R 13/24* (2006.01)
*H01R 12/73* (2011.01)

(58) Field of Classification Search
USPC .................. 439/74, 947, 108, 215, 212, 251
See application file for complete search history.

(56) References Cited

U.S. PATENT DOCUMENTS 8,734,167 B2 * 5/2014 Aimoto ................ H01R 13/187 439/74
8,926,375 B2 1/2015 Chen
8,968,010 B2 * 3/2015 Endo ........................ H01R 4/48 439/82

* cited by examiner

POWER CONNECTION APPARATUS ASSEMBLY AND POWER CONNECTION APPARATUS

RELATED APPLICATIONS

This application claims priority to Taiwanese Application No. 105211764, filed Aug. 4, 2016, which is incorporated herein by reference in its entirety.

TECHNICAL FIELD

The present disclosure relates to a power connection apparatus assembly, particularly relates to a power connection apparatus assembly and a power connection apparatus for conducting a large current.

BACKGROUND ART

The existing power connection apparatus assembly for connecting a power typically comprises two connectors respectively provided to two circuit boards, and two circuit boards are provided at a right angle relative to each other after the two connectors has been mated. For example, those are disclosed in Chinese patent CN203481527U and CN103825122B.

Because each connector of the existing power connection apparatus assembly comprises an insulating housing and a plurality of conductive terminals, it still has an improvement space in structure and cost.

SUMMARY

Therefore, an object of the present disclosure is to provide a power connection apparatus assembly which is simpler in structure and may save cost and is beneficial to dissipate heat.

Therefore, another object of the present disclosure is to provide a power connection apparatus which is simpler in structure and may save cost and is beneficial to dissipate heat.

Accordingly, in some embodiments, a power connection apparatus assembly of the present disclosure comprises a first power connection apparatus and a second power connection apparatus. The first power connection apparatus comprises at least one connecting unit and a first circuit board. The connecting unit comprises a conductive member and a positioning member, the conductive member has a mounting plate portion and an inserting plate portion bending from the mounting plate portion and extending, the mounting plate portion has at least one positioning hole, the positioning member has a flat plate portion cooperating with the mounting plate portion and at least one protruding post protruding from the flat plate portion to correspondingly pass through the positioning hole. The first circuit board has at least one mounting unit corresponding to the at least one connecting unit, the mounting unit comprises a conductive pad for providing the mounting plate portion and at least one insertion hole corresponding to the at least one positioning hole in position to allow the protruding post to insert therein, the protruding post of the positioning member passes through the positioning hole of the mounting plate portion of the conductive member and inserts into the insertion hole so that the mounting plate portion and the first circuit board are positioned relative to each other, the mounting plate portion is fixed and connected to the conductive pad so as to form an electrical connection. The second power connection apparatus comprises a second circuit board; and at least one electrical connector corresponding to the at least one connecting unit. The electrical connector is provided to the second circuit board and comprises an insulating housing having an insertion slot and a plurality of terminals provided to the insulating housing. The inserting plate portion of the conductive member may insert into the insertion slot and contact the terminals to form an electrical connection. After the inserting plate portion has inserted into the insertion slot, the first circuit board and the second circuit board are parallel to each other.

In some embodiments, the protruding post is a circular cylinder, the positioning hole and the insertion hole are circular holes.

In some embodiments, the protruding post has a post body and at least one protruding rib protruding from an outer periphery of the post body.

In some embodiments, the mounting plate portion further has a first middle hole positioned in a middle region, the flat plate portion of the positioning member has a second middle hole corresponding to the first middle hole in position.

In some embodiments, the mounting unit of the first circuit board further comprises a third middle hole passing through a board body of the first circuit board and the conductive pad and corresponding to the first middle hole in position, the first middle hole, the second middle hole and the third middle hole allow a fixing member to pass through so as to fix the conductive member to the first circuit board.

In some embodiments, the mounting plate portion has a plurality of positioning holes, the positioning member has a plurality of protruding posts protruding from the flat plate portion and respectively corresponding to the positioning holes in position so as to respectively pass through the positioning holes, the mounting unit of the first circuit board comprises a plurality of insertion holes respectively corresponding to the positioning holes in position so as to respectively allow the protruding posts to insert therein.

In some embodiments, the mounting plate portion further has a first middle hole positioned in a middle region, and the positioning holes surround the first middle hole and are spaced apart from each other, the flat plate portion of the positioning member has a second middle hole corresponding to the first middle hole in position, and the protruding posts surround the second middle hole and are spaced apart from each other.

In some embodiments, the mounting unit of the first circuit board further comprises a third middle hole passing through a board body of the first circuit board and the conductive pad and corresponding to the first middle hole in position, the first middle hole, the second middle hole and the third middle hole allow a fixing member to pass through so as to fix the conductive member to the first circuit board.

In some embodiments, the connecting unit further comprises a conductive plate, the conductive plate has a fixing hole for allowing the fixing member to pass through, the conductive plate and the conductive member are together fixed to two opposite sides of the first circuit board by the fixing member and form an electrical connection.

In some embodiments, the connecting unit further comprises a spacer provided between the conductive plate and the first circuit board to space apart the conductive plate from the first circuit board.

In some embodiments, the protruding posts are circular cylinders, the positioning holes and the insertion holes are circular holes, at least two of the protruding posts have different diameters, and diameters of the positioning holes and diameters of the insertion holes correspondingly cooperate with the diameters of the protruding post.

Accordingly, in some embodiments, a power connection apparatus of the present disclosure comprises at least one connecting unit and a circuit board. The connecting unit comprises a conductive member and a positioning member, the conductive member has a mounting plate portion and an inserting plate portion bending from the mounting plate portion and extending, the mounting plate portion has at least one positioning hole, the positioning member has a flat plate portion cooperating with the mounting plate portion and at least one protruding post protruding from the flat plate portion to correspondingly pass through the positioning hole. The circuit board has at least one mounting unit corresponding to the at least one connecting unit, the mounting unit comprising a conductive pad for providing the mounting plate portion and at least one insertion hole corresponding to the at least one positioning hole in position to allow the protruding post to insert therein, the protruding post of the positioning member passes through the positioning hole of the mounting plate portion of the conductive member and inserts into the insertion hole so that the mounting plate portion and the circuit board are positioned relative to each other, the mounting plate portion is fixed and connected to the conductive pad so as to form an electrical connection.

In some embodiments, the protruding post is a circular cylinder, the positioning hole and the insertion hole are circular holes.

In some embodiments, the protruding post has a post body and at least one protruding rib protruding from an outer periphery of the post body.

In some embodiments, the mounting plate portion further has a first middle hole positioned in a middle region, the flat plate portion of the positioning member has a second middle hole corresponding to the first middle hole in position.

In some embodiments, the mounting unit of the circuit board further comprises a third middle hole passing through a board body of the circuit board and the conductive pad and corresponding to the first middle hole in position, the first middle hole, the second middle hole and the third middle hole allow a fixing member to pass through so as to fix the conductive member to the circuit board.

In some embodiments, the mounting plate portion has a plurality of positioning holes, the positioning member has a plurality of protruding posts protruding from the flat plate portion and respectively corresponding to the positioning holes in position so as to respectively pass through the positioning holes, the mounting unit of the circuit board comprises a plurality of insertion holes respectively corresponding to the positioning holes in position so as to respectively allow the protruding posts to insert therein.

In some embodiments, the mounting plate portion further has a first middle hole positioned in a middle region, and the positioning holes surround the first middle hole and are spaced apart from each other, the flat plate portion of the positioning member has a second middle hole corresponding to the first middle hole in position, and the protruding posts surround the second middle hole and are spaced apart from each other.

In some embodiments, the mounting unit of the circuit board further comprises a third middle hole passing through a board body of the circuit board and the conductive pad and corresponding to the first middle hole in position, the first middle hole, the second middle hole and the third middle hole allow a fixing member to pass through so as to fix the conductive member to the circuit board.

In some embodiments, the connecting unit further comprises a conductive plate, the conductive plate has a fixing hole for allowing the fixing member to pass through, the conductive plate and the conductive member are together fixed to two opposite sides of the circuit board by the fixing member and form an electrical connection.

In some embodiments, the connecting unit further comprises a spacer provided between the conductive plate and the circuit board to space apart the conductive plate from the circuit board.

In some embodiments, the protruding posts are circular cylinders, the positioning holes and the insertion holes are circular holes, at least two of the protruding posts have different diameters, and diameters of the positioning holes and diameters of the insertion holes correspondingly cooperate with the diameters of the protruding post.

In some embodiments, a power connection apparatus of the present disclosure comprises at least one connecting unit and a circuit board. The connecting unit comprises a conductive member, a positioning member and a conductive plate. The conductive member has a mounting plate portion and an inserting plate portion bending from the mounting plate portion and extending, the mounting plate portion having at least one positioning hole and a first middle hole positioned in a middle region. The positioning member has a flat plate portion cooperating with the mounting plate portion and at least one protruding post protruding from the flat plate portion to correspondingly pass through the positioning hole. The flat plate portion has a second middle hole corresponding to the first middle hole in position. The conductive plate has a fixing hole. The circuit board has at least one mounting unit corresponding to the at least one connecting unit, the mounting unit comprises at least one insertion hole corresponding to the at least one positioning hole in position for allow the protruding post to insert therein. The protruding post of the positioning member passes through the positioning hole of the mounting plate portion of the conductive member and inserts into the insertion hole so that the mounting plate portion and the circuit board are positioned relative to each other. The mounting unit further comprises a third middle hole passing through a board body of the circuit board and corresponding to the first middle hole in position, the first middle hole, the second middle hole, the third middle hole and the fixing hole allow a fixing member to pass through, the conductive plate and the conductive member are together fixed to two opposite sides of the circuit board by the fixing member and forming an electrical connection.

In some embodiments, the connecting unit further comprises a spacer provided between the conductive plate and the circuit board to space apart the conductive plate from the circuit board.

In some embodiments, the protruding post is a circular cylinder, the positioning hole and the insertion hole are circular holes, the protruding post has a post body and at least one protruding rib protruding from an outer periphery of the post body.

In some embodiments, the mounting plate portion has a plurality of positioning holes, and the positioning holes surround the first middle hole and are spaced apart from each other, the positioning member has a plurality of protruding posts protruding from the flat plate portion and respectively corresponding to the positioning holes in position, and the protruding posts surround the second middle hole and are spaced apart from each other so as to respectively pass through the positioning holes, the mounting unit of the circuit board comprises a plurality of insertion holes respectively corresponding to the positioning holes in position so as to respectively allow the protruding posts to insert therein.

In some embodiments, the protruding posts are circular cylinders, the positioning holes and the insertion holes are circular holes, at least two of the protruding posts have different diameters, and diameters of the positioning holes and diameters of the insertion holes correspondingly cooperate with the diameters of the protruding post.

The present disclosure at least has the following effects: by that the conductive member is directly fixed to the first circuit board, the first power connection apparatus may omit the insulating housing, not only material cost may be saved, but also the conductive member more easily dissipates heat because the conductive member is not covered by the insulating housing. The conductive member and the positioning member are separately manufactured and then assembled, which may be easer in manufacturing, and may have a better positioning effect. The conductive plate may be further provided, so that the first circuit board may not provide a trace conducting power but only conduct a signal, which may increase design flexibility of the first circuit board in trace layout.

BRIEF DESCRIPTION OF THE DRAWINGS

Other features and effects of the present disclosure will be apparent from the embodiments with reference to figures, in which.

DETAILED DESCRIPTION OF THE PREFERRED EMBODIMENTS

Figure 1:
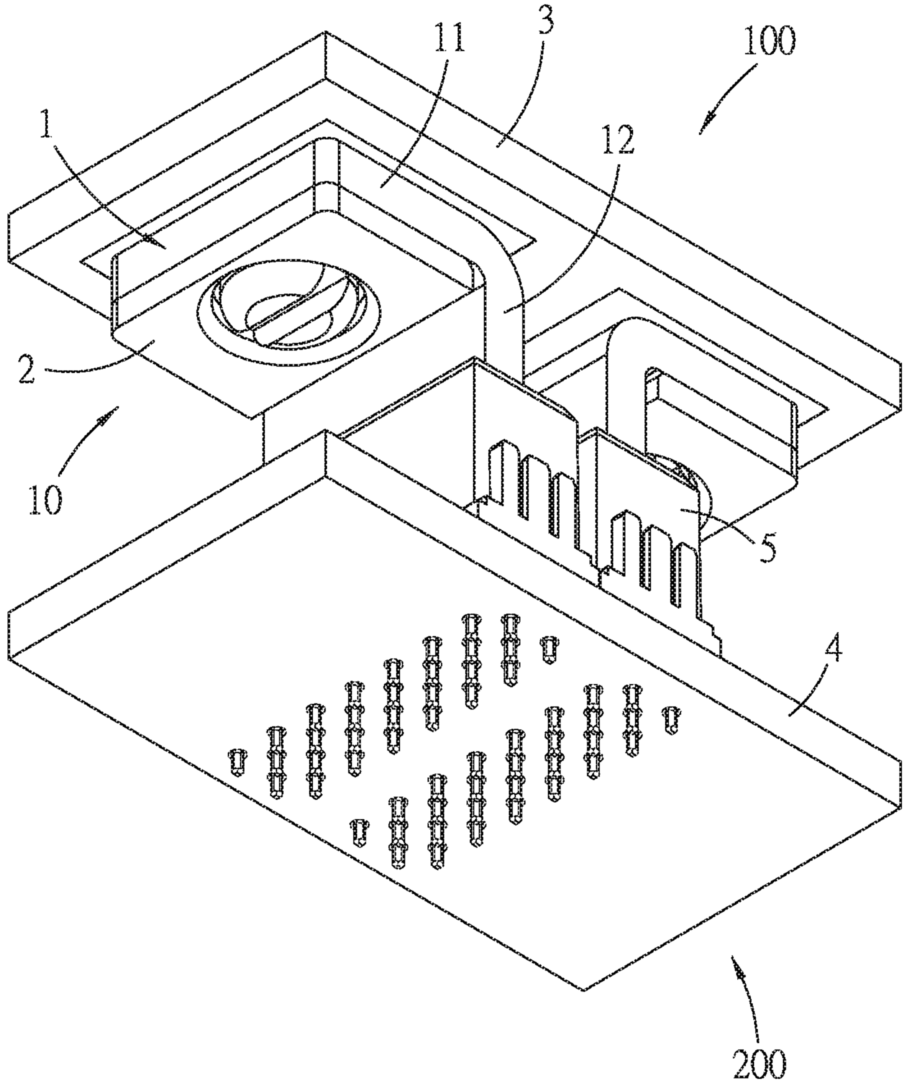
FIG. 1 is a perspective view of a first embodiment of a power connection apparatus assembly of the present disclosure.

Before the present disclosure is described in detail, it should be noted that like elements are indicated by the same reference numerals in the following description.

Figure 2:
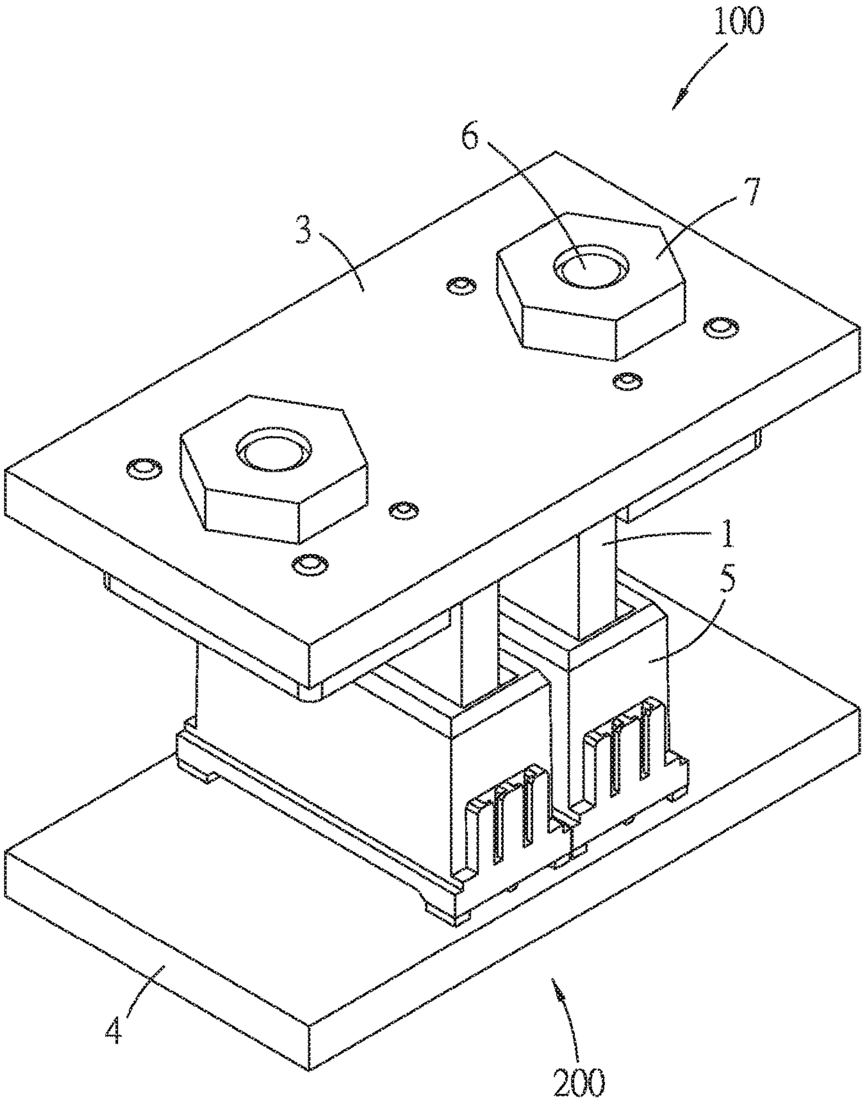
FIG. 2 is a view of FIG. 1 from another angle.
Figure 3:
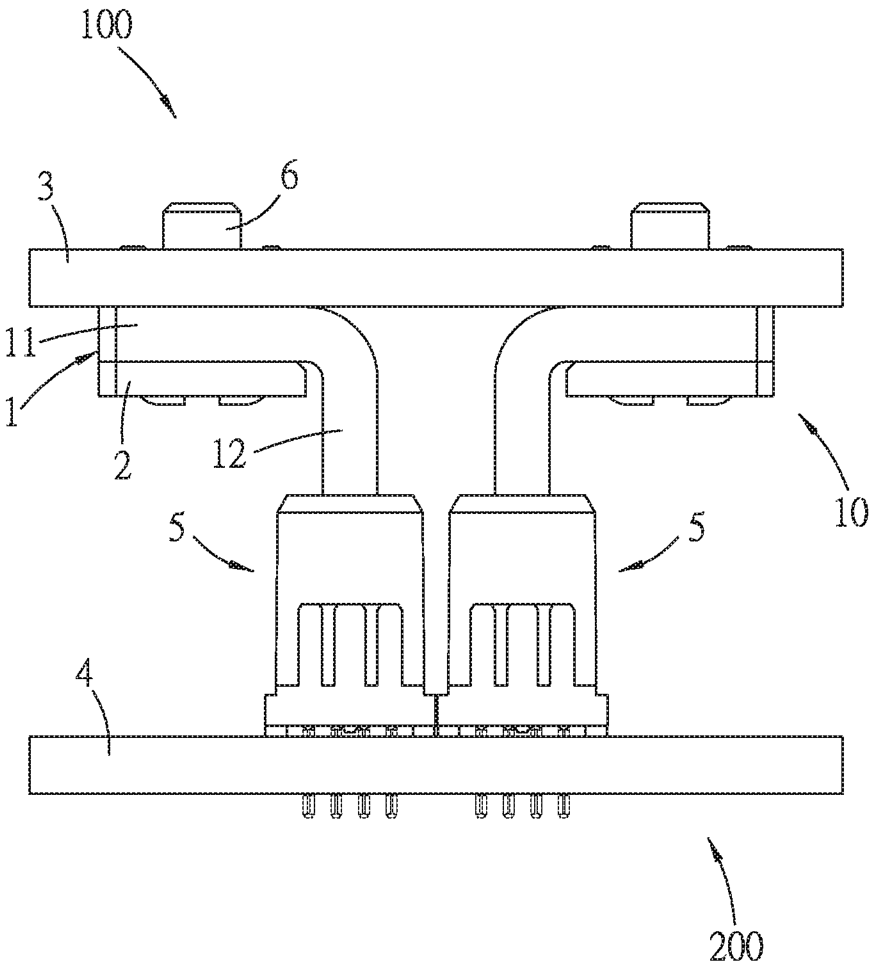
FIG. 3 is a side view of the first embodiment.

Referring to FIG. 1 to FIG. 3, a first embodiment of a power connection apparatus assembly of the present disclosure comprises a first power connection apparatus 100 and a second power connection apparatus 200. In the embodiment, the first power connection apparatus 100 comprises two connecting units 10 and a first circuit board 3, the second power connection apparatus 200 comprises a second circuit board 4 and two electrical connectors 5. The two connecting units 10 respectively connect with the two electrical connectors 5, in which one group of the connecting unit 10 and electrical connector 5 is used to conduct power, the other group of the connecting unit 10 and electrical connector 5 is used to ground, however, ground path may be additionally designed, therefore, that the first power connection apparatus 100 has only one connecting unit 10 and the second power connection apparatus 200 has only one electrical connector 5 is used to conduct power and also may be implemented.

Figure 4:
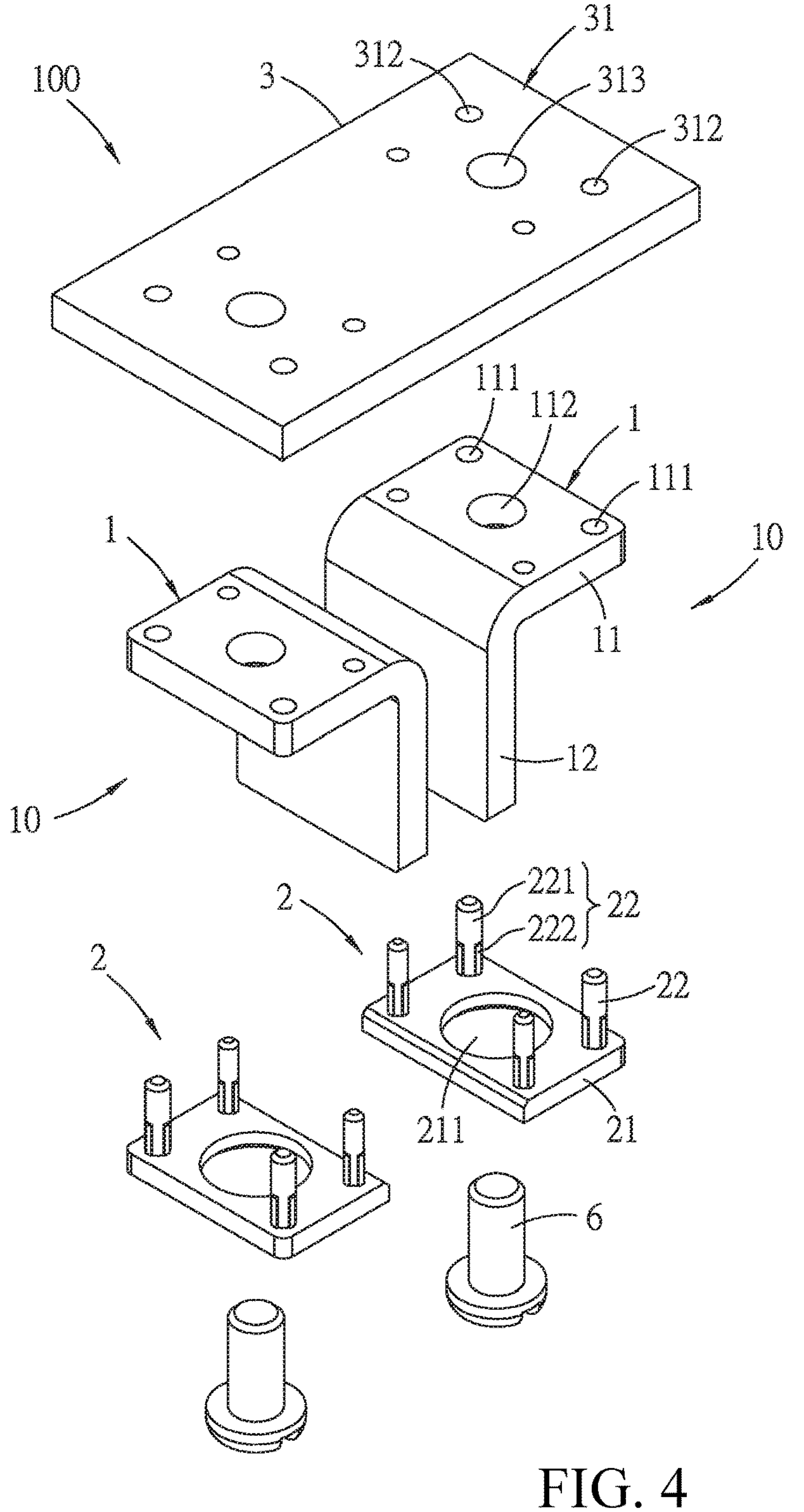
FIG. 4 is an exploded perspective view of a first power connection apparatus of the first embodiment.
Figure 5:
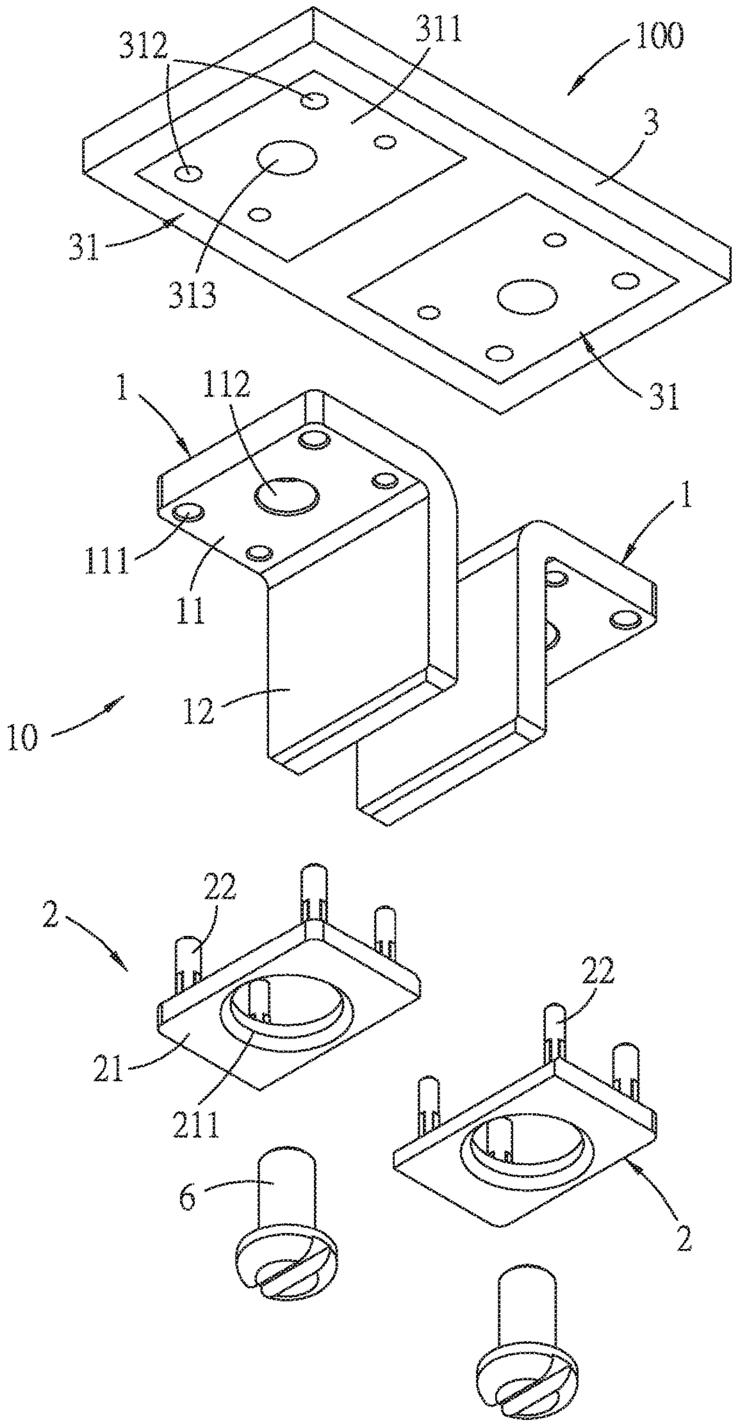
FIG. 5 is a view of FIG. 4 from another angle.
Figure 6:
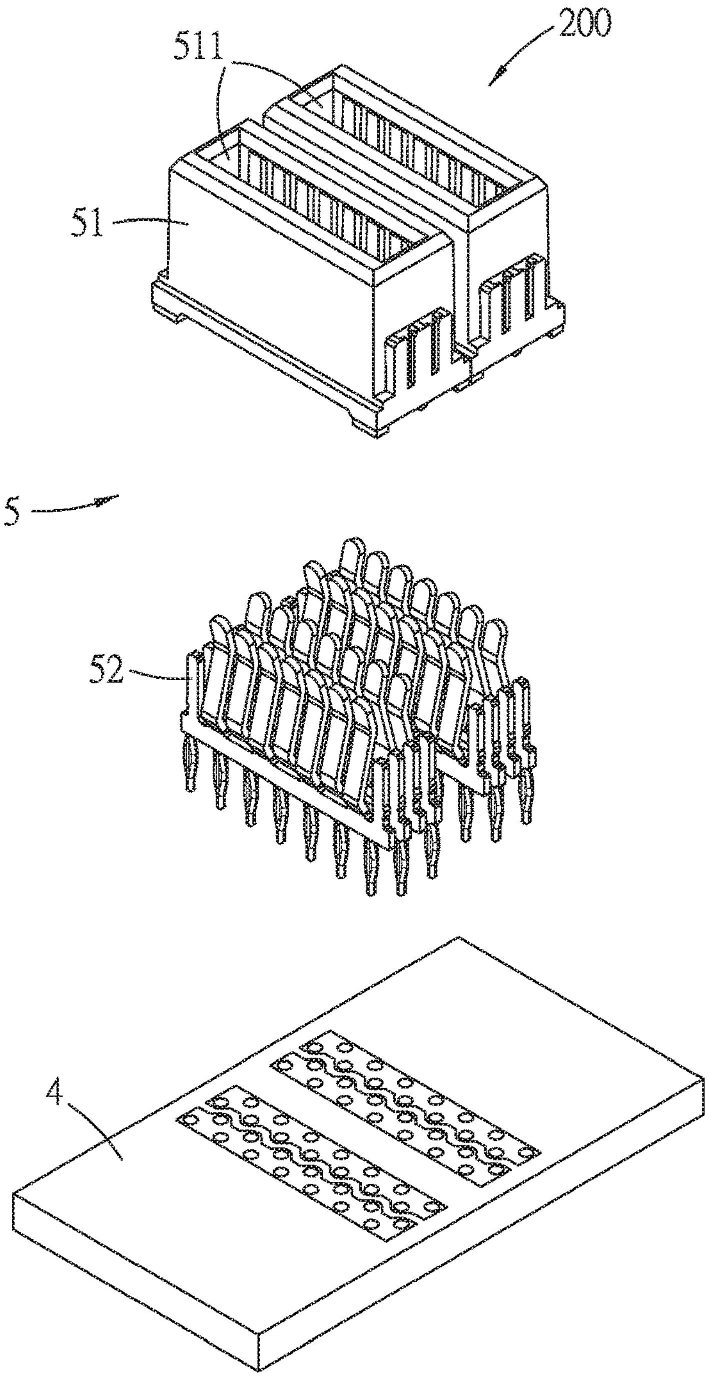
FIG. 6 is an exploded perspective view of a second power connection apparatus of the first embodiment.
Figure 7:
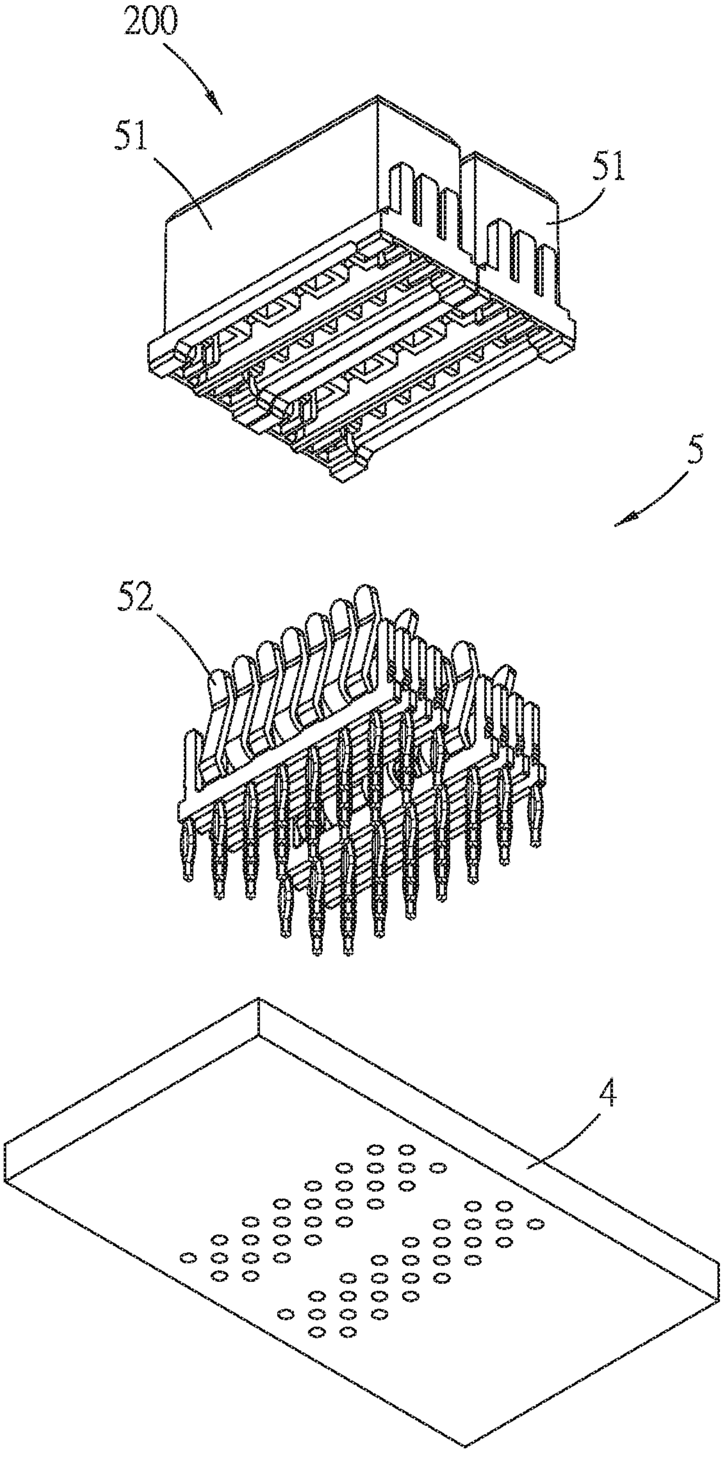
FIG. 7 is a view of FIG. 6 from another angle.
Figure 8:
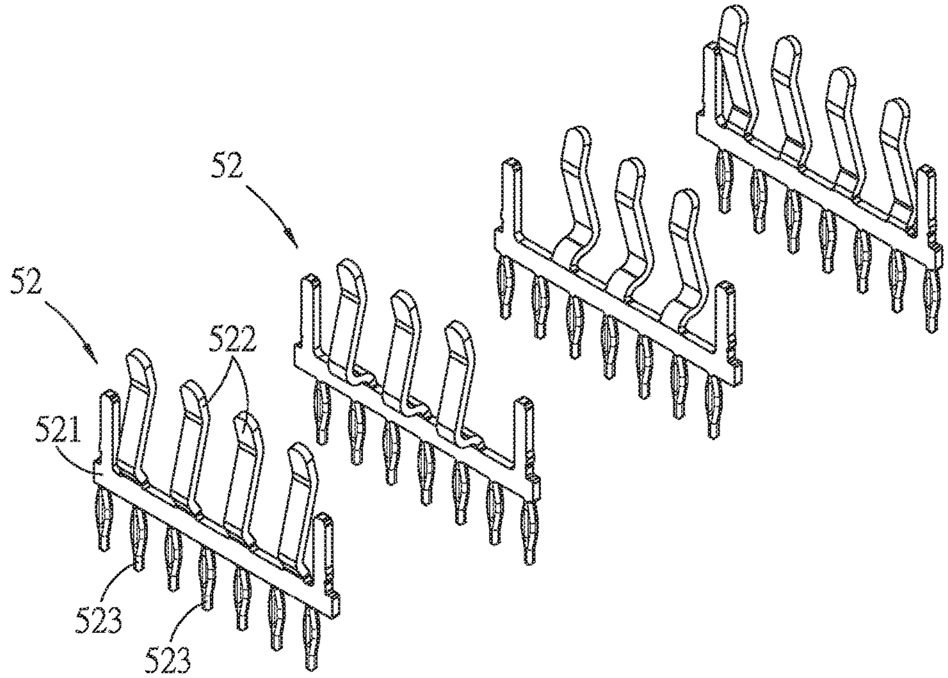
FIG. 8 is an exploded perspective view of a plurality of terminals of the second power connection apparatus of the first embodiment.

Additionally in combination with referring to FIG. 4 and FIG. 5, each connecting unit 10 comprises a conductive member 1 and a positioning member 2. The conductive member 1 has a mounting plate portion 11 and an inserting plate portion 12 bending from the mounting plate portion 11 and extending. In the embodiment, the mounting plate portion 11 and the inserting plate portion 12 are generally perpendicular to each other. The mounting plate portion 11 has a plurality of positioning holes 111 and a first middle hole 112 positioned in a middle region, and the positioning holes 111 surround the first middle hole 112 and are spaced apart from each other. The positioning member 2 has a flat plate portion 21 cooperating with the mounting plate portion 11 and a plurality of protruding posts 22 protruding from the flat plate portion 21 to correspondingly pass through the positioning holes 111. The flat plate portion 21 of the positioning member 2 has a second middle hole 211 corresponding to the first middle hole 112 in position, and the protruding posts 22 are spaced apart from each other and surround the second middle hole 211. The first circuit board 3 has two mounting units 31 corresponding to the two connecting units 10. Each mounting unit 31 comprises a conductive pad 311 for providing the mounting plate portion 11 and a plurality of insertion holes 312 respectively corresponding to the positioning holes 111 in position so as to respectively allow the protruding posts 22 to insert therein. The protruding posts 22 of the positioning member 2 respectively pass through the positioning holes 111 of the mounting plate portion 11 of the conductive member 1 and respectively insert into the insertion holes 312, so that the mounting plate portion 11 and the first circuit board 3 are positioned relative to each other, in turn it assures that the inserting plate portion 12 is positioned at a preset position so as to mate with the corresponding electrical connector 5. The mounting unit 31 further comprises a third middle hole 313 which passes through a board body of the first circuit board 3 and the conductive pad 311 and corresponds to the first middle hole 112 in position, the first middle hole 112, the second middle hole 211 and the third middle hole 313 allow a fixing member 6 to pass through so as to fix the conductive member 1 to the first circuit board 3 and allow the mounting plate portion 11 to be fixed and connected to the conductive pad 311 so as to form an electrical connection. By that the conductive member 1 is directly fixed to first circuit board 3, the insulating housing is omitted, which not only may save material cost, but also the conductive member 1 is not covered by the insulating housing and more easily dissipates heat.

In the embodiment, the fixing member 6 is a bolt and cooperates with a nut 7 (see FIG. 2) to fix the conductive member 1 to the first circuit board 3 in threaded connection. The fixing member 6 is not limited to the bolt, other existing equivalent member also may be implemented. In the embodiment, the protruding posts 22 are circular cylinders, the positioning holes 111 and the insertion holes 312 are circular holes, the protruding post 22 passes through the positioning hole 111 in interference fit to allow the positioning member 2 and the mounting plate portion 11 to be engaged and fixed. At least two of the protruding posts 22 have different diameters, and diameters of the positioning holes 111 and diameters of the insertion holes 312 correspondingly cooperate with the diameters of the protruding posts 22. Describing based on an orientation as shown in FIG. 4 for example, in the embodiment, the two inserting plate portions 12 of the two conductive members 1 are adjacent and positioned between the two mounting plate portions 11; the mounting plate portion 11 of each conductive member 1 has four positioning holes 111, in which the diameters of two positioning holes 111 close to the inserting plate portion 12 are smaller than the diameters of the other two positioning holes 111 close to the outside and far away from the inserting plate portion 12. The two mounting units 31 of the first circuit board 3 respectively correspond to the positioning holes 111 of the two mounting plate portions 11, in the four insertion holes 312 of each mounting unit 31, the diameters of two insertion holes 312 positioned adjacent to the other mounting unit 31 (that is at the inside) are smaller than the diameters of the other two insertion holes 312 positioned at the opposite outside. In the four protruding posts 22 of each positioning member 2, the diameters of the two protruding posts 22 positioned at the inside relative to the other positioning member 2 are smaller than the diameters of the other two protruding posts 22 positioned at the opposite outside. The protruding posts 22 of the positioning member 2 cooperate with the positioning holes 111 of the mounting plate portion 11 and the insertion holes 312 of the first circuit board 3 to mount the conductive member 1 to a preset position of the first circuit board 3, improperly mounting the inserting plate portion 12 in position can be avoided. For example, if the mounting plate portion 11 of one of the conductive members 1 is rotated by 180 degrees, the inserting plate portion 12 of the one conductive member 1 is positioned at the outside relative to the other conductive member 1, a distance between the two inserting plate portions 12 of the two conductive members 1 will be larger than a predetermined distance between the two inserting plate portions 12, thus the two inserting plate portions 12 cannot correspondingly mate with the two electrical connectors 5. Therefore that the diameters of the protruding posts 22 differently cooperate with corresponding positioning holes 111 and the insertion holes 312 may avoid the mounting plate portion 11 being provided as rotated by 180 degrees, and may further assure proper mounting. Also, in the embodiment, each protruding post 22 has a post body 221 and at least one protruding rib 222 protruding from an outer periphery of the post body 221 so as to allow that the protruding post 22 can be more tightly positioned in the corresponding positioning hole 111 of the mounting plate portion 11 and allow the positioning member 2 and the mounting plate portion 11 to be more securely engaged. Although in the embodiment, each positioning member 2 has a plurality of protruding posts 22, each mounting plate portion 11 has a plurality of positioning holes 111, each mounting unit 31 has a plurality of insertion holes 312, that each positioning member 2 only has one protruding post 22, each mounting plate portion 11 correspondingly only has one positioning hole 111, each mounting unit 31 correspondingly only has one insertion hole 312 may be also implemented. A group of the corresponding protruding post 22, positioning hole 111 and insertion hole 312 may form a first positioning point, the fixing member 6, the second middle hole 211, the first middle hole 112 and the third middle hole 313 may form a second positioning point, the two positioning points may also allow the mounting plate portion 11 and the first circuit board 3 to be positioned relative to each other and allow the conductive member 1 to be properly positioned and mounted on the first circuit board 3. The positioning members 2 may be made of metal or plastic, and plastic is lower in material cost. The conductive member 1 and the positioning member 2 are separately manufactured and then assembled, which may be easier in manufacturing and may be better in positioning effect.

Figure 9:
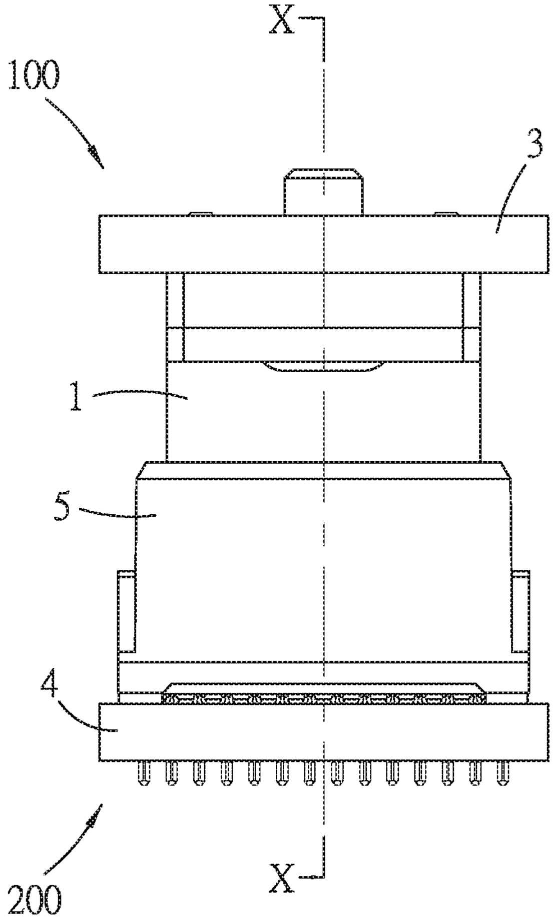
FIG. 9 is another side view of the first embodiment.
Figure 10:
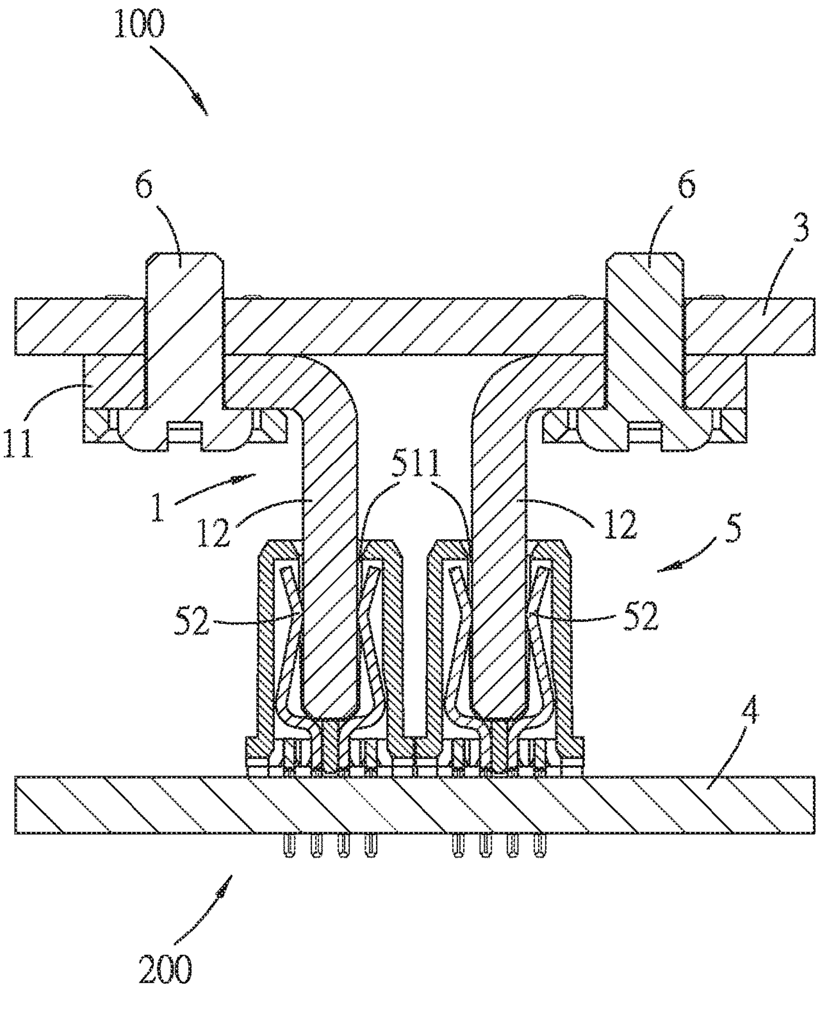
FIG. 10 is a cross sectional view taken along a line X-X of FIG. 9.

Additionally in combination with referring to FIG. 5 to FIG. 8, the two electrical connectors 5 respectively corresponding to the two connecting units 10 and provided to the second circuit board 4. Each electrical connector 5 comprises an insulating housing 51 having an insertion slot 511 and a plurality of terminals 52 provided to the insulating housing 51. The terminals 52 are arranged as total of two groups in which every two terminals 52 form one group so that two groups are respectively provided to two sides of the insertion slot 511. Each terminal 52 has a fixed portion 521, a plurality of contact portions 522 connecting with the fixed portion 521 and a plurality of soldering portions 523 connecting with the fixed portion 521. The contact portions 522 of the two terminals 52 in each group are alternately arranged to form a row and together protrude toward the insertion slot 511 (see FIG. 10). Referring to FIG. 9 and FIG. 10, the corresponding conductive member 1 and electrical connector 5 may be mated with each other, the inserting plate portion 12 of the conductive member 1 may be inserted into the corresponding insertion slot 511 and contact the terminals 52 to form an electrical connection, the plurality of contact portions 522 may increase stability of the electrical connection. After the inserting plate portion 12 has inserted into the insertion slot 511, the first circuit board 3 and the second circuit board 4 are parallel to each other.

Figure 11:
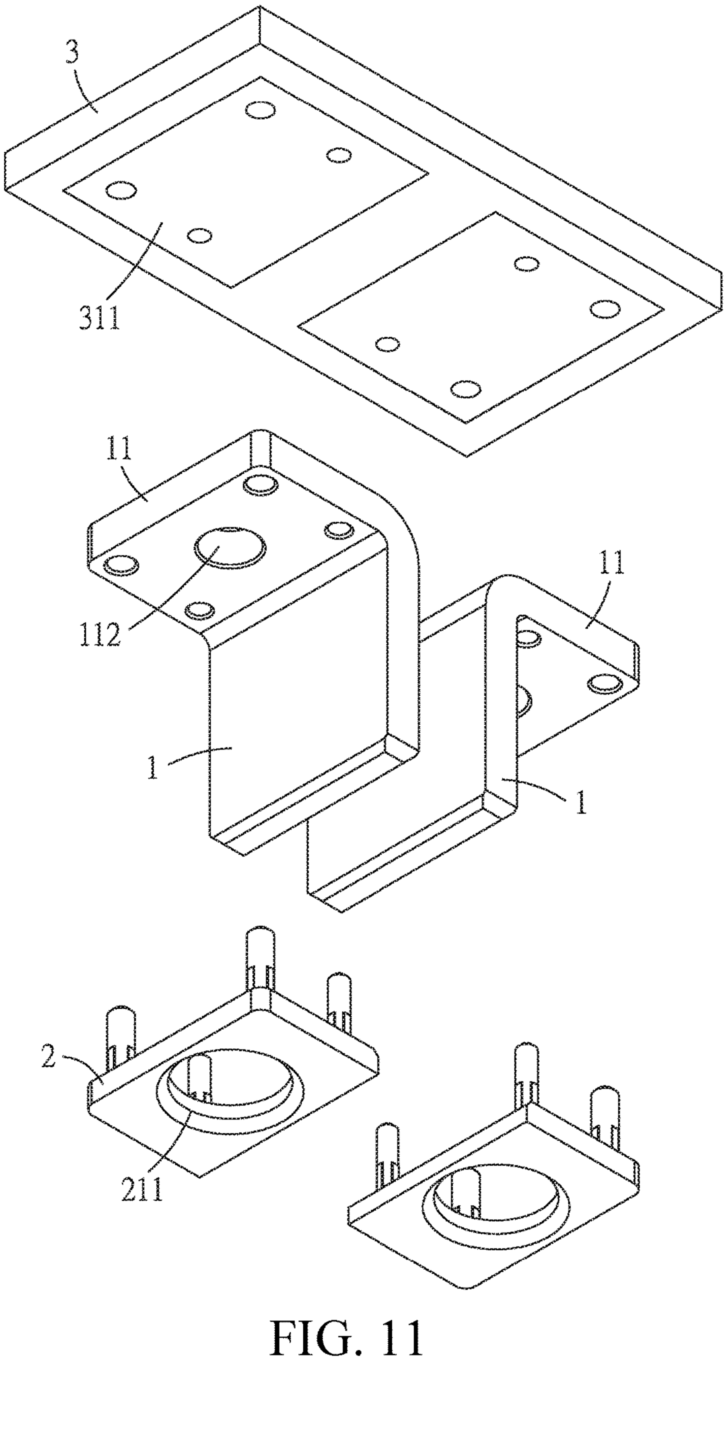
FIG. 11 is an exploded perspective view of a first power connection apparatus of a second embodiment of the power connection apparatus assembly of the present disclosure.
Figure 12:
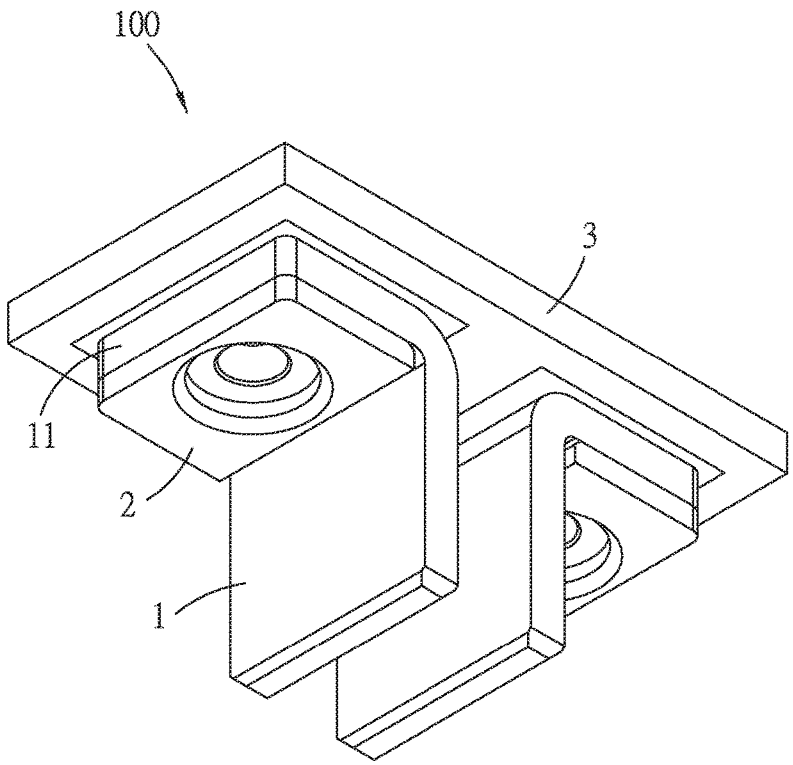
FIG. 12 is a perspective view of the first power connection apparatus of the second embodiment.

Referring to FIG. 11 and FIG. 12, a second embodiment of the power connection apparatus assembly of the present disclosure is substantially the same as the first embodiment, however, in the second embodiment, the conductive members 1 of the first power connection apparatus 100 are fixed to the first circuit board 3 by soldering, that is, the mounting plate portion 11 is soldered to the conductive pad 311, therefore the first circuit board 3 is not provided with the third middle hole 313 (see FIG. 5). In the embodiment, the first middle hole 112 of the mounting plate portion 11 of the conductive member 1 and the second middle hole 211 of the positioning member 2 may provide a space for solder spreading during soldering, so as to increase soldering strength. Certainly, it may be also implemented as that the first middle hole 112 and the second middle hole 211 are omitted.

Figure 13:
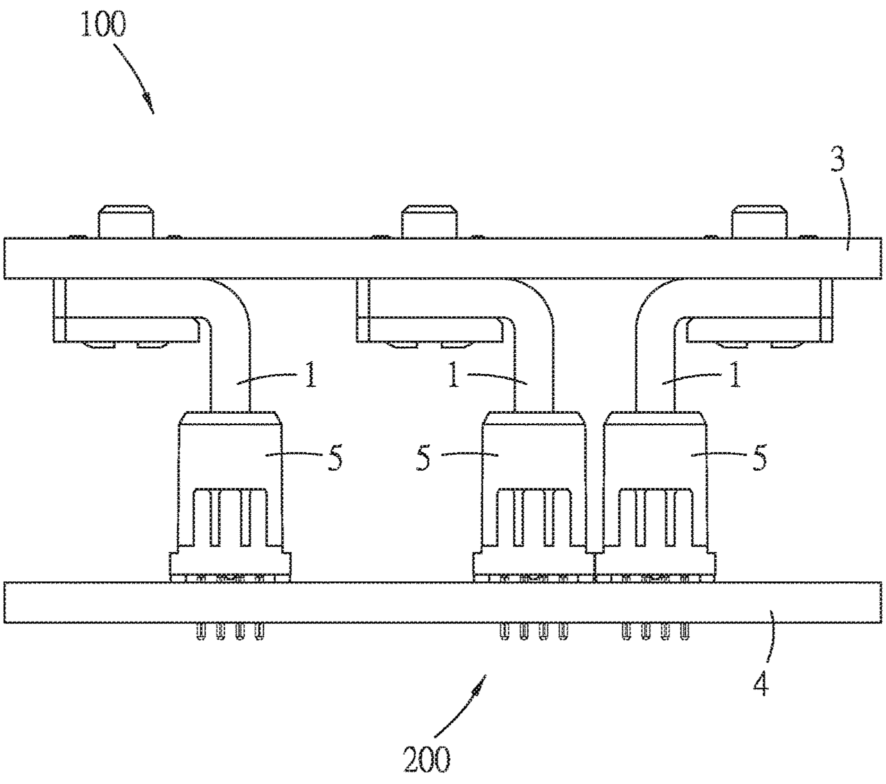
FIG. 13 is a side view of a third embodiment of the power connection apparatus assembly of the present disclosure.
Figure 14:
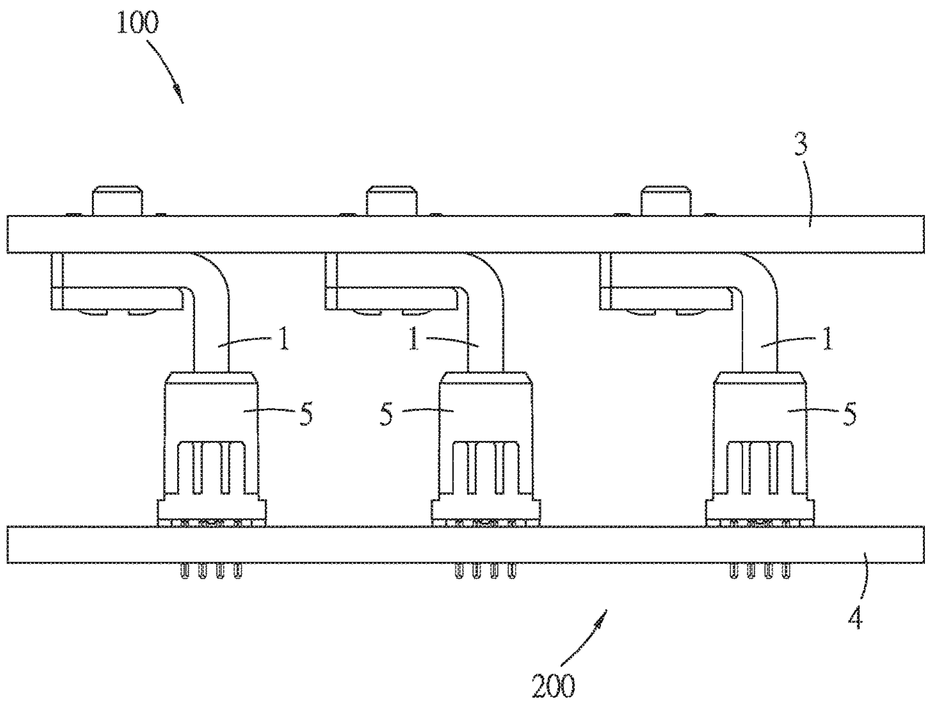
FIG. 14 is a side view of a fourth embodiment of the power connection apparatus assembly of the present disclosure.

Referring to FIG. 13 and FIG. 14, a third embodiment and a fourth embodiment of the power connection apparatus assembly of the present disclosure are illustrated, the third and fourth embodiments show that the first power connection apparatus 100 may provide a plurality of conductive members 1 to conduct different powers, and a mounting direction of the conductive member 1 may be adjusted depending on use requirement, and the second power connection apparatus 200 provides corresponding electrical connectors 5 which correspond to the conductive members 1 in position.

Figure 15:
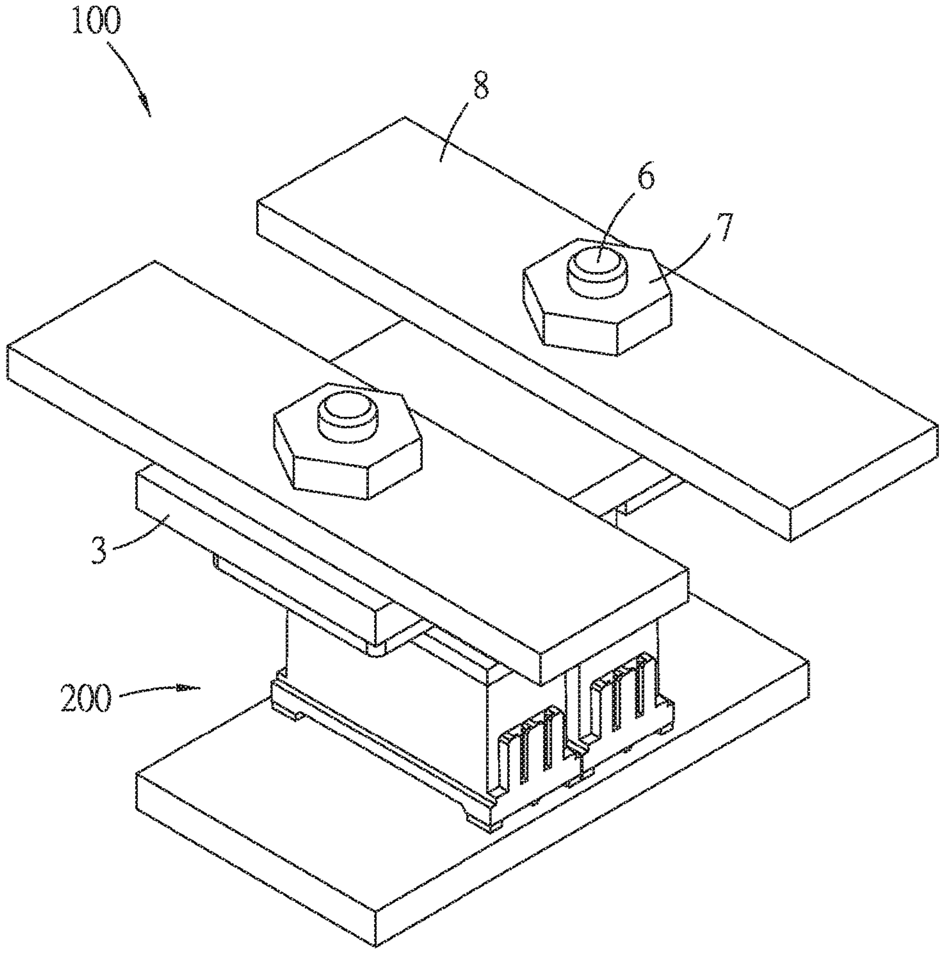
FIG. 15 is a perspective view of a fifth embodiment of the power connection apparatus assembly of the present disclosure.
Figure 16:
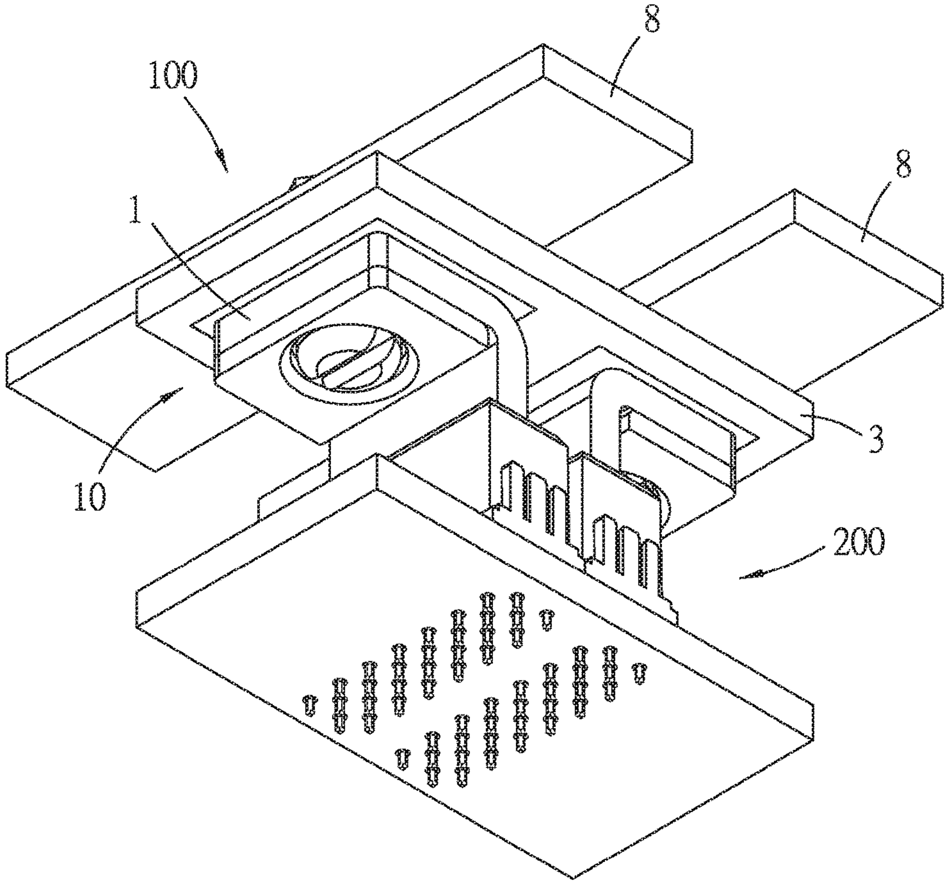
FIG. 16 is a view of FIG. 15 from another angle.
Figure 17:
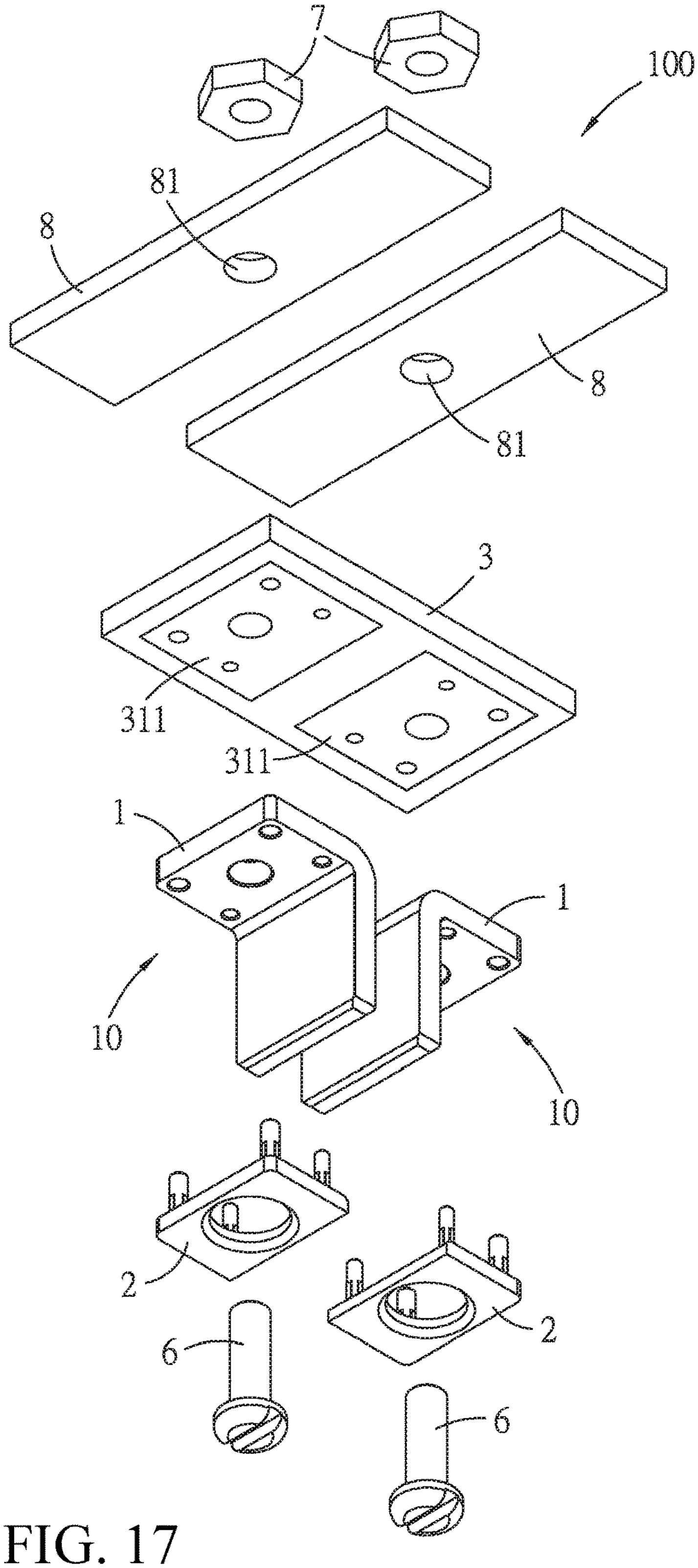
FIG. 17 is an exploded perspective view of a first power connection apparatus of the fifth embodiment.

Referring to FIG. 15 to FIG. 17, a fifth embodiment of the power connection apparatus assembly of the present disclosure is substantially the same as the first embodiment, however, in the fifth embodiment, each connecting unit 10 of the first power connection apparatus 100 further comprises a conductive plate 8, the conductive plate 8 has a fixing hole 81 for allowing the fixing member 6 to pass through, the conductive plate 8 and the conductive member 1 together are fixed to two opposite sides of the first circuit board 3 by the fixing member 6 and form an electrical connection. Therefore, power may be directly conducted from the conductive member 1 to the conductive plate 8, and then conducted from conductive plate 8 to an electronic element (not shown) which requires power. As such, the first circuit board 3 may not provide a trace conducting power but only may conduct a signal, which increases design flexibility of the first circuit board 3 in trace layout. If power is not conducted via the first circuit board 3, the conductive pad 311 may be omitted and may be not provided.

Figure 18:
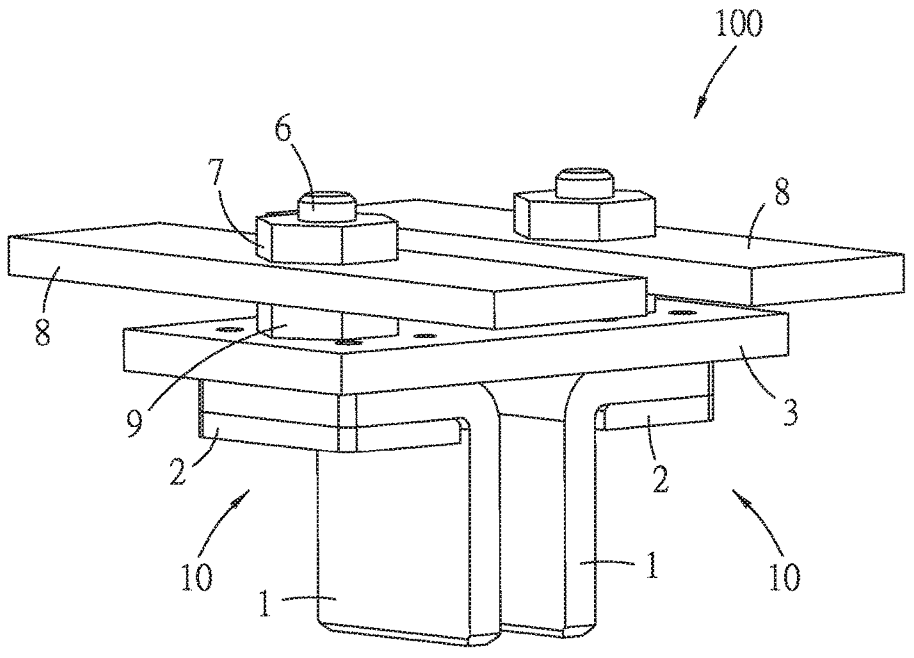
FIG. 18 is a perspective view of a first power connection apparatus of a sixth embodiment of the power connection apparatus assembly of the present disclosure.
Figure 19:
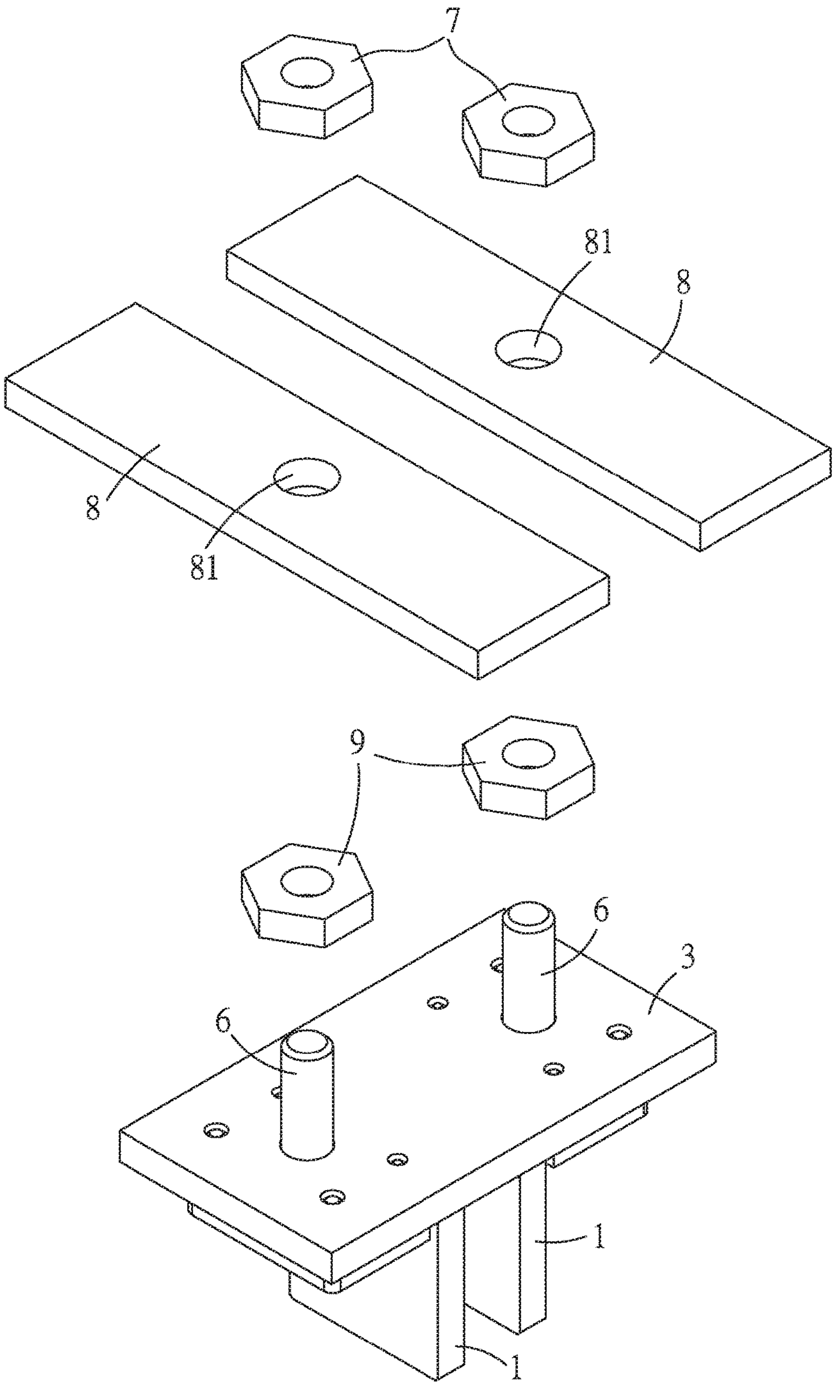
FIG. 19 is an exploded perspective view of the first power connection apparatus of the sixth embodiment.

Referring to FIG. 18 and FIG. 19, a sixth embodiment of the power connection apparatus assembly of the present disclosure is substantially the same as the fifth embodiment, however, in the sixth embodiment, the connecting unit 10 further comprises a spacer 9 provided between the conductive plate 8 and the first circuit board 3 to space apart the conductive plate 8 from the first circuit board 3, which may eliminate a contact area between the conductive plate 8 and the first circuit board 3 but increase an area of trace layout on the first circuit board 3. In the embodiment, the spacer 9 is a nut which may be conveniently mounted, but the spacer 9 may also be made of plastic, as long as it can attain the effect to space apart the conductive plate 8 from the first circuit board 3, and this is not used to limit the present disclosure.

In conclusion, by that the conductive member 1 is directly fixed to the first circuit board 3, the first power connection apparatus 100 may omit the insulating housing, not only material cost may be saved, but also the conductive member 1 more easily dissipates heat because the conductive member 1 is not covered by the insulating housing. The conductive member 1 and the positioning member 2 are separately manufactured and then assembled, which may be easer in manufacturing, and may have a better positioning effect. The conductive plate 8 may be further provided, so that the first circuit board 3 may not provide a trace conducting power but only conduct a signal, which may increase design flexibility of the first circuit board 3 in trace layout.

The above contents are merely embodiments of the present disclosure and the scope of implementing the present disclosure cannot be limited to those. Any simple equivalent changes and modifications made according to the scope of the claims and the contents of the specification of the present disclosure are fallen within the scope of the present disclosure.

What is claimed is:

1. A power connection apparatus assembly, comprising:

a first power connection apparatus comprising:

at least one connecting unit, the connecting unit comprising a conductive member and a positioning member, the conductive member having a mounting plate portion and an inserting plate portion bending from the mounting plate portion and extending, the mounting plate portion having at least one positioning hole, the positioning member having a flat plate portion cooperating with the mounting plate portion and at least one protruding post protruding from the flat plate portion to correspondingly pass through the positioning hole; and a first circuit board having at least one mounting unit corresponding to the at least one connecting unit, the mounting unit comprising a conductive pad for providing the mounting plate portion and at least one insertion hole corresponding to the at least one positioning hole in position to allow the protruding post to insert therein, the protruding post of the positioning member passing through the positioning hole of the mounting plate portion of the conductive member and inserting into the insertion hole so that the mounting plate portion and the first circuit board are positioned relative to each other, the mounting plate portion being fixed and connected to the conductive pad so as to form an electrical connection; and a second power connection apparatus comprising:

a second circuit board; and at least one electrical connector corresponding to the at least one connecting unit and provided to the second circuit board, the electrical connector comprises an insulating housing having an insertion slot and a plurality of terminals provided to the insulating housing, the inserting plate portion of the conductive member may insert into the insertion slot and contact the terminals to form an electrical connection, after the inserting plate portion has inserted into the insertion slot, the first circuit board and the second circuit board are parallel to each other.

2. The power connection apparatus assembly of claim 1, wherein the protruding post is a circular cylinder, the positioning hole and the insertion hole are circular holes.

3. The power connection apparatus assembly of claim 2, wherein the protruding post has a post body and at least one protruding rib protruding from an outer periphery of the post body.

4. The power connection apparatus assembly of claim 1, wherein the mounting plate portion further has a first middle hole positioned in a middle region, the flat plate portion of the positioning member has a second middle hole corresponding to the first middle hole in position.

5. The power connection apparatus assembly of claim 4, wherein the mounting unit of the first circuit board further comprises a third middle hole passing through a board body of the first circuit board and the conductive pad and corresponding to the first middle hole in position, the first middle hole, the second middle hole and the third middle hole allow a fixing member to pass through so as to fix the conductive member to the first circuit board.

6. The power connection apparatus assembly of claim 1, wherein the mounting plate portion has a plurality of positioning holes, the positioning member has a plurality of protruding posts protruding from the flat plate portion and respectively corresponding to the positioning holes in position so as to respectively pass through the positioning holes, the mounting unit of the first circuit board comprises a plurality of insertion holes respectively corresponding to the positioning holes in position so as to respectively allow the protruding posts to insert therein.

7. The power connection apparatus assembly of claim 6, wherein the mounting plate portion further has a first middle hole positioned in a middle region, and the positioning holes surround the first middle hole and are spaced apart from each other, the flat plate portion of the positioning member has a second middle hole corresponding to the first middle hole in position, and the protruding posts surround the second middle hole and are spaced apart from each other.

8. The power connection apparatus assembly of claim 7, wherein the mounting unit of the first circuit board further comprises a third middle hole passing through a board body of the first circuit board and the conductive pad and corresponding to the first middle hole in position, the first middle hole, the second middle hole and the third middle hole allow a fixing member to pass through so as to fix the conductive member to the first circuit board.

9. The power connection apparatus assembly of claim 5, wherein the connecting unit further comprises a conductive plate, the conductive plate has a fixing hole for allowing the fixing member to pass through, the conductive plate and the conductive member are together fixed to two opposite sides of the first circuit board by the fixing member and form an electrical connection.

10. The power connection apparatus assembly of claim 9, wherein the connecting unit further comprises a spacer provided between the conductive plate and the first circuit board to space apart the conductive plate from the first circuit board.

11. The power connection apparatus assembly of claim 6, wherein the protruding posts are circular cylinders, the positioning holes and the insertion holes are circular holes, at least two of the protruding posts have different diameters, and diameters of the positioning holes and diameters of the insertion holes correspondingly cooperate with the diameters of the protruding post.

12. A power connection apparatus, comprising:

at least one connecting unit, the connecting unit comprising a conductive member and a positioning member, the conductive member having a mounting plate portion and an inserting plate portion bending from the mounting plate portion and extending, the mounting plate portion having at least one positioning hole, the positioning member having a flat plate portion cooperating with the mounting plate portion and at least one protruding post protruding from the flat plate portion to correspondingly pass through the positioning hole; and a circuit board having at least one mounting unit corresponding to the at least one connecting unit, the mounting unit comprising a conductive pad for providing the mounting plate portion and at least one insertion hole corresponding to the at least one positioning hole in position to allow the protruding post to insert therein, the protruding post of the positioning member passing through the positioning hole of the mounting plate portion of the conductive member and inserting into the insertion hole so that the mounting plate portion and the circuit board are positioned relative to each other, the mounting plate portion being fixed and connected to the conductive pad so as to form an electrical connection.

13. The power connection apparatus of claim 12, wherein the protruding post is a circular cylinder, the positioning hole and the insertion hole are circular holes.

14. The power connection apparatus of claim 13, wherein the protruding post has a post body and at least one protruding rib protruding from an outer periphery of the post body.

15. The power connection apparatus of claim 12, wherein the mounting plate portion further has a first middle hole positioned in a middle region, the flat plate portion of the positioning member has a second middle hole corresponding to the first middle hole in position.

16. The power connection apparatus of claim 15, wherein the mounting unit of the circuit board further comprises a third middle hole passing through a board body of the circuit board and the conductive pad and corresponding to the first middle hole in position, the first middle hole, the second middle hole and the third middle hole allow a fixing member to pass through so as to fix the conductive member to the circuit board.

17. The power connection apparatus of claim 12, wherein the mounting plate portion has a plurality of positioning holes, the positioning member has a plurality of protruding posts protruding from the flat plate portion and respectively corresponding to the positioning holes in position so as to respectively pass through the positioning holes, the mounting unit of the circuit board comprises a plurality of insertion holes respectively corresponding to the positioning holes in position so as to respectively allow the protruding posts to insert therein.

18. The power connection apparatus of claim 17, wherein the mounting plate portion further has a first middle hole positioned in a middle region, and the positioning holes surround the first middle hole and are spaced apart from each other, the flat plate portion of the positioning member has a second middle hole corresponding to the first middle hole in position, and the protruding posts surround the second middle hole and are spaced apart from each other.

19. The power connection apparatus of claim 18, wherein the mounting unit of the circuit board further comprises a third middle hole passing through a board body of the circuit board and the conductive pad and corresponding to the first middle hole in position, the first middle hole, the second middle hole and the third middle hole allow a fixing member to pass through so as to fix the conductive member to the circuit board.

20. The power connection apparatus of claim 16, wherein the connecting unit further comprises a conductive plate, the conductive plate has a fixing hole for allowing the fixing member to pass through, the conductive plate and the conductive member are together fixed to two opposite sides of the circuit board by the fixing member and form an electrical connection.

21. The power connection apparatus of claim 20, wherein the connecting unit further comprises a spacer provided between the conductive plate and the circuit board to space apart the conductive plate from the circuit board.

22. The power connection apparatus of claim 17, wherein the protruding posts are circular cylinders, the positioning holes and the insertion holes are circular holes, at least two of the protruding posts have different diameters, and diameters of the positioning holes and diameters of the insertion holes correspondingly cooperate with the diameters of the protruding post.

23. A power connection apparatus, comprising:

at least one connecting unit, the connecting unit comprising a conductive member, a positioning member and a conductive plate, the conductive member having a mounting plate portion and an inserting plate portion bending from the mounting plate portion and extending, the mounting plate portion having at least one positioning hole and a first middle hole positioned in a middle region, the positioning member having a flat plate portion cooperating with the mounting plate portion and at least one protruding post protruding from the flat plate portion to correspondingly pass through the positioning hole, the flat plate portion having a second middle hole corresponding to the first middle hole in position, the conductive plate having a fixing hole; and a circuit board having at least one mounting unit corresponding to the at least one connecting unit, the mounting unit comprising at least one insertion hole corresponding to the at least one positioning hole in position for allow the protruding post to insert therein, the protruding post of the positioning member passing through the positioning hole of the mounting plate portion of the conductive member and inserting into the insertion hole so that the mounting plate portion and the circuit board are positioned relative to each other, the mounting unit further comprising a third middle hole passing through a board body of the circuit board and corresponding to the first middle hole in position, the first middle hole, the second middle hole, the third middle hole and the fixing hole allowing a fixing member to pass through, the conductive plate and the conductive member being together fixed to two opposite sides of the circuit board by the fixing member and forming an electrical connection.

24. The power connection apparatus of claim 23, wherein the connecting unit further comprises a spacer provided between the conductive plate and the circuit board to space apart the conductive plate from the circuit board.

25. The power connection apparatus of claim 23, wherein the protruding post is a circular cylinder, the positioning hole and the insertion hole are circular holes, the protruding post has a post body and at least one protruding rib protruding from an outer periphery of the post body.

26. The power connection apparatus of claim 23, wherein the mounting plate portion has a plurality of positioning holes, and the positioning holes surround the first middle hole and are spaced apart from each other, the positioning member has a plurality of protruding posts protruding from the flat plate portion and respectively corresponding to the positioning holes in position, and the protruding posts surround the second middle hole and are spaced apart from each other so as to respectively pass through the positioning holes, the mounting unit of the circuit board comprises a plurality of insertion holes respectively corresponding to the positioning holes in position so as to respectively allow the protruding posts to insert therein.

27. The power connection apparatus of claim 26, wherein the protruding posts are circular cylinders, the positioning holes and the insertion holes are circular holes, at least two of the protruding posts have different diameters, and diameters of the positioning holes and diameters of the insertion holes correspondingly cooperate with the diameters of the protruding post.

* * * * *